US011961705B2

(12) United States Patent
Rhinow et al.

(10) Patent No.: US 11,961,705 B2
(45) Date of Patent: Apr. 16, 2024

(54) METHOD AND APPARATUS FOR EXAMINING A BEAM OF CHARGED PARTICLES

(71) Applicants: Elke Hoinkis, Darmstadt (DE); Carl Zeiss SMT GmbH, Oberkochen (DE)

(72) Inventors: Daniel Rhinow, Frankfurt am Main (DE); Markus Bauer, Rossdorf (DE); Rainer Fettig, Steinmauern (DE); David Lämmle, Darmstadt (DE); Marion Batz, Wiesbaden (DE); Katharina Gries, Darmstadt (DE); Sebastian Vollmar, Dieburg (DE); Petra Spies, Mainz (DE); Ottmar Hoinkis, Darmstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 74 days.

(21) Appl. No.: 17/130,044

(22) Filed: Dec. 22, 2020

(65) Prior Publication Data

US 2021/0110996 A1 Apr. 15, 2021

Related U.S. Application Data

(63) Continuation of application No. PCT/EP2019/066855, filed on Jun. 25, 2019.

(30) Foreign Application Priority Data

Jun. 27, 2018 (DE) .................. 102018210522.7

(51) Int. Cl.
*H01J 37/304* (2006.01)
*H01J 37/21* (2006.01)
(Continued)

(52) U.S. Cl.
CPC ............ *H01J 37/304* (2013.01); *H01J 37/21* (2013.01); *H01J 37/28* (2013.01);
(Continued)

(58) Field of Classification Search
CPC .......... H01J 37/304; H01J 37/21; H01J 37/28; H01J 37/3178; H01J 2237/063; H01J 2237/14; H01J 2237/21; H01J 2237/28
See application file for complete search history.

(56) References Cited

U.S. PATENT DOCUMENTS 5,382,895 A   1/1995 Elmer et al.
7,105,843 B1  9/2006 Pearl
(Continued)

FOREIGN PATENT DOCUMENTS

DE   102 32 230     2/2004
DE   102012102608   10/2013
(Continued)

OTHER PUBLICATIONS

English translation of the Notice of Reasons for Rejection issued by the Japanese Patent Office for Application No. JP 2020-573279, dated Jan. 6, 2022.
(Continued)

*Primary Examiner* — David E Smith
(74) *Attorney, Agent, or Firm* — Fish & Richardson P.C.

(57) ABSTRACT

The present invention relates to a method for examining a beam of charged particles, including the following steps: producing persistent interactions of the beam with a sample at a plurality of positions of the sample relative to the beam and deriving at least one property of the beam by analyzing the spatial distribution of the persistent interactions at the plurality of positions.

39 Claims, 8 Drawing Sheets

(51) Int. Cl.
*H01J 37/28* (2006.01)
*H01J 37/317* (2006.01)

(52) U.S. Cl.
CPC ..... *H01J 37/3178* (2013.01); *H01J 2237/063* (2013.01); *H01J 2237/14* (2013.01); *H01J 2237/21* (2013.01); *H01J 2237/28* (2013.01)

(56) References Cited

U.S. PATENT DOCUMENTS

| | | | |
|---|---|---|---|
| 2005/0173650 A1* | 8/2005 | Lower | B23K 15/00 250/397 |
| 2005/0285047 A1 | 12/2005 | Elmer et al. | |
| 2010/0116984 A1* | 5/2010 | Ogawa | H01J 37/3056 250/311 |
| 2012/0273458 A1 | 11/2012 | Bret et al. | |
| 2012/0274358 A1 | 11/2012 | Bret et al. | |
| 2015/0083928 A1 | 3/2015 | Reisgen et al. | |
| 2016/0020066 A1* | 1/2016 | Morishita | H01J 37/222 702/151 |
| 2017/0002467 A1* | 1/2017 | Straw | C23C 16/4418 |

FOREIGN PATENT DOCUMENTS

| | | |
|---|---|---|
| DE | 102015105515 | 10/2016 |
| JP | S63 78443 | 4/1988 |
| JP | 2008-204722 | 9/2008 |
| WO | WO 2012/146647 | 7/2020 |

OTHER PUBLICATIONS

The German Office Action for German Application No. DE 102018210522.7, dated Apr. 26, 2019.
The Taiwan Office Action for Taiwan Application No. TW 108122641 dated Aug. 4, 2020 (with English Translation).
Dilthey, U. et al., "Electron beam diagnostics: a new release of the diabeam system", *Vacuum*, vol. 62, pp. 77-85 (2001).
Liddle, J. A. et al., "Probe shape measurement in an electron beam lithography system", *J. Vac. Sci. Technol. B*, vol. 22, No. 6, pp. 2897-2901 (Nov./Dec. 2004).

* cited by examiner

METHOD AND APPARATUS FOR EXAMINING A BEAM OF CHARGED PARTICLES

CROSS-REFERENCE TO RELATED APPLICATIONS

This application is a continuation of and claims priority under 35 U.S.C. § 120 from PCT Application No. PCT/EP2019/066855, filed on Jun. 25, 2019, which claims priority from German Application No. 10 2018 210 522.7, filed on Jun. 27, 2018. The entire contents of each of these priority applications are incorporated herein by reference.

TECHNICAL FIELD

The present invention relates to a method, an apparatus and a computer program for examining a beam of charged particles, such as electron beams or ion beams, for example.

BACKGROUND

On account of their short de Broglie wavelength, beams of charged particles, such as electron beams, for example, allow spatial structures to be resolved, which are substantially smaller than the resolution capability of light-optical instruments.

By way of example, this is used in electron and/or ion microscopy. In particular, modern particle-optical systems facilitate not only the resolution and examination of structures down into the sub-nanometer range but also the targeted manipulation thereof. A method and an apparatus for processing a substrate using a particle beam are known, for example, from the earlier application WO 2012/146647 A2 by the applicant.

Further, the electron-optical systems for repairing photolithography masks which are commercially distributed by the applicant under the trademark "MeRiT®" allow the correction of defects of such masks by an electron beam, for example. Here, the correction accuracy is determined, inter alia, by the minimally achievable diameter of the electron beam.

It is known that, for a given particle-optical system, the quality of the particle beam can influence the minimal beam diameter. In particular, particle-optical aberrations and other beam disturbances may lead to an increase in the minimum beam diameter and, as a result thereof, reduce the positional accuracy and the resolution of the respective particle-optical system.

Thus, there is an interest in developing methods and apparatuses for determining the quality of particle beams and improving the latter where necessary.

SUMMARY

The problem explained above is solved at least in part by the subject matter of the independent claims of the present invention. Exemplary embodiments are described in the dependent claims.

In one embodiment, the present invention provides a method for examining a beam of charged particles, wherein the method comprises the following steps: producing persistent interactions of the beam with a sample at a plurality of positions of the sample relative to the beam and deriving at least one property of the beam by analyzing the spatial distribution of the persistent interactions at the plurality of positions.

By way of such a method, it is possible to derive beam properties, for example, such as a numerical aperture, a magnification scale, a beam profile and imaging disturbances and/or wavefront disturbances such as an astigmatism, spherical aberrations, chromatic aberrations and/or a telecentricity error of the beam optical unit, and beam form distortions of the particle beam (e.g., on account of electric charging in the beam optical unit).

The systematic derivation of such beam properties from a plurality of persistent interactions for a given particle-optical system can then render it possible to determine what type of aberrations and/or beam disturbances may be the cause of a negative influence on the quality of the particle beam. Building thereon, countermeasures can be undertaken in a targeted fashion where necessary in order to remove, or at least reduce, the respective aberrations and/or beam disturbances and thereby improve the resolution capability of the system.

In particular, the method provided by the present invention can facilitate the step of deriving the at least one property of the beam comprising the comparison of the spatial distribution of the persistent interactions with a mathematical model of the beam. By way of example, such a mathematical model of the beam can comprise at least a Zernike polynomial, a Gauss-Hermite polynomial and/or a Gauss-Laguerre polynomial, and a phase factor.

In general, any mathematical model allowing the intensity and phase distribution of the beam in space to be described by a sum with a finite number of terms with progressively reducing weighting can be suitable to this end. In particular, the at least one property of the beam can be determined by Zernike analysis, at least partly on the basis of the spatial distribution of the persistent interaction.

Further, at least some of the plurality of positions of the sample can be arranged at different points in the direction of propagation of the beam.

By way of example, this allows changes of the beam in the propagation direction to be linked to changes in the spatial distribution of the persistent interactions and the systematic analysis thereof.

Likewise, at least some of the plurality of positions can be arranged at different points orthogonal to the direction of propagation of the beam.

By way of example, this allows changes of the beam orthogonal to the propagation direction to be linked to changes in the spatial distribution of the persistent interactions and the systematic analysis thereof.

The beam can be a focused beam in some embodiments of the present invention.

In such a case, there typically is a change in the beam profile of the beam, both in the propagation direction and in the plane orthogonal to the propagation direction. By way of example, a focused beam can have a substantially Gaussian beam profile in the focus of the beam. The method provided by the present invention now allows the derivation of one or more beam properties of such a focused beam in a systematic fashion. In particular, it can be possible to analyze what could cause a given beam of charged particles to have a focal size that is greater than desired, predicted and/or typical. Here, and in the remainder of the application, the term "substantially" should be interpreted to mean "within usual structural, detection, calculation and/or processing tolerances."

In some embodiments of the present invention, the plurality of positions can be adjusted at least in part by a change in a focal position of the beam.

By way of example, the position of the sample can be substantially fixed in space and the focal position of the beam can be modified by adjusting at least one beam optical unit of the beam. By way of example, the focal position in a scanning particle microscope can be adjusted both in the propagation direction of the beam and in the plane orthogonal to the propagation direction by adjusting the beam optical unit of the scanning particle microscope relative to the sample. In particular, this allows the persistent interactions to be produced at different positions on the surface of the sample, with the distance between the focal position and the sample in the propagation direction likewise being able to be systematically varied.

As an alternative or in addition thereto, it is also possible to vary the position of the sample relative to the beam and, in particular, relative to the focal position of the beam, for example by displacement of a sample stage or a sample holder. By way of example, the sample can be assembled on a piezoelectric actuator which allows the position of the sample to be controlled, in at least one spatial direction or preferably in three spatial directions.

In particular, at least some of the plurality of the positions can lie in the far field of the focus of the beam. Here, the term "far field" should be understood to mean that it comprises all distances from the focal position that are spaced apart from the focus by a multiple of the depth-of-field range. Preferably, the distance is at least two times, more preferably at least three times, even more preferably four times and most preferably at least five times the depth-of-field range.

In particular, a systematic analysis of the spatial distribution of the persistent interactions in the far field of the focus can allow the detection of particle-optical aberrations and/or beam disturbances, which would not be detectable, or only insufficiently detectable, in the case of an analysis of the spatial distribution of the persistent interactions in the near field of the focus. By way of example, wavefront disturbances such as spherical aberrations and a possibly present astigmatism of the beam can be detected less ambiguously and more accurately by an analysis of the persistent interactions in the far field of the focus than is typically the case in the focus or in the vicinity of the focus.

Further, the analysis of the spatial distribution of the persistent interactions can comprise the determination of at least part of a beam profile, in particular.

By way of example, the analysis of the spatial distribution of the persistent interactions can comprise at least one of the following steps: estimating the length of a semi-major and/or semi-minor axis of the beam profile, with these coinciding in the case of a substantially round beam profile, estimating an angle between the semi-major and/or semi-minor axis of the beam profile in relation to a reference direction, estimating the position of the centroid of the beam profile relative to the position of a reference point, estimating a particle current density at the centroid of the beam profile, or estimating a mean particle current density of the beam profile. Further, the complete pupil function (spatially resolved amplitude and phase in the pupil) can be determined from sufficiently many images of the beam profiles at various positions upstream and downstream of the focus by way of phase-reconstruction methods.

In some embodiments, the persistent interactions can comprise persistent changes in part of the surface of the sample.

By way of example, this allows the spatial distribution of the persistent interaction to be analyzed by various detection methods, such as, e.g., light-optical, particle-optical and/or x-ray-optical methods and atomic force detection methods.

By way of example, the production of the persistent interactions can comprise the beam-induced deposition of material from the vapor phase onto the part of the surface of the sample. By way of example, the deposited material can be a metal, a metallic compound, a carbon compound or an oxide. In particular use can be made of $SiO_2$, carbon, TEOS or $Mo(CO)_6$, for example.

Here, the deposited material can be obtained from at least one precursor material in some embodiments of the present invention.

By way of example, one or more of the following substances come into question as precursor material:
- (metal, transition element, main group) alkyls such as cyclopentadienyl-(Cp) or methylcyclopentadienyl-(MeCp) trimethylplatinum ($CpPtMe_3$ and $MeCpPtMe_3$, respectively), tetramethyltin $SnMe_4$, trimethylgallium $GaMe_3$, ferrocene $Cp_2Fe$, bis-aryl chromium $Ar_2Cr$ and further such compounds;
- (metal, transition element, main group) carbonyls such as chromium hexacarbonyl $Cr(CO)_6$, molybdenum hexacarbonyl $Mo(CO)_6$, tungsten hexacarbonyl $W(CO)_6$, dicobalt octacarbonyl $Co_2(CO)_8$, triruthenium dodecacarbonyl $Ru_3(CO)_{12}$, iron pentacarbonyl $Fe(CO)_5$ and further such compounds;
- (metal, transition element, main group) alkoxides such as tetraethoxysilane $Si(OC_2H_5)$, tetraisopropoxytitanium $Ti(OC_3H_7)_4$ and further such compounds;
- (metal, transition element, main group) halides such as $WF_6$, $WCl_6$, $TiCl_6$, $BCl_3$, $SiCl_4$ and further such compounds;
- (metal, transition element, main group) complexes such as copper bis(hexafluoroacetylacetonate) $Cu(C_5F_6HO_2)_2$, dimethylgold trifluoroacetylacetonate $Me_2Au$ $(C_5F_3H_4O_2)$ and further such compounds;
- organic compounds such as CO, $CO_2$, aliphatic or aromatic hydrocarbons, constituents of vacuum pump oils, volatile organic compounds and further such compounds.

Moreover, one or more of the following additional gases can be used:
- oxidants such as $O_2$, $O_3$, $H_2O$, $H_2O_2$, $N_2O$, NO, $NO_2$, $HNO_3$ and further oxygen-containing gases;
- halides such as $Cl_2$, HCl, $XeF_2$, HF, $I_2$, HI, $Br_2$, HBr, NOCl, $PCl_3$, $PCl_5$, $PF_3$ and further halogen-containing gases;
- gases with a reducing effect such as $H_2$, $NH_3$, $CH_4$ and further hydrogen-containing gases.

In some embodiments, the step of producing the persistent interactions can further comprise at least one of:
a. reducing a concentration of the at least one precursor material;
b. increasing an intensity of the beam of charged particles;
c. depleting the precursor material in at least one higher intensity portion (1000) of the beam; or
d. changing an interaction duration of the beam with the sample (130).

In other words, the present invention provides a method for examining a beam of charged particles, including the steps of: producing persistent interactions of the beam with a sample at one or more positions of the sample relative to the beam; wherein the production of the persistent interactions depends sub-linearly on the intensity of the beam and deriving at least one property of the beam by analyzing the spatial distribution of the persistent interactions at the one or more positions.

For instance, the production rate of the persistent interactions can decrease with increasing intensity of the beam of charged particles. This allows to ensure that the spatial distribution of the persistent interactions does not directly correspond to the actual beam profile (i.e., the intensity distribution) of the beam of charged particles but provides a better contrast for low-intensity regions of the beam. In this way, charged particles that are not within the (e.g., Gaussian shaped) core region of the beam of charged particles can better be taken into account when analyzing the spatial distribution of the persistent interactions.

This allows to increase the detection resolution for the low-intensity background region of the beam of charged particles. By analyzing the spatial distribution of the persistent interactions in these low-intensity regions of the beam information on higher-order beam aberrations can be obtained that otherwise may be obscured by the high intensity core region of the beam. Such higher-order beam aberrations can for example be produced to localized charge concentrations on one or more of the beam optical assemblies, units and/or components used to generate and direct the beam of charged particles onto the sample.

As discussed in detail above such a precursor material can comprise a gas of Tetraethyl orthosilicate (TEOS) or similar chemical compounds. Reducing the concentration of such a precursor material can allow to render the production of the persistent interactions to be limited by the presence of the precursor material in the high intensity core region of the beam of charged particles. In other words, most of the charged particles in the high intensity core region of the beam do not contribute to the production of the persistent interactions because there are not enough precursor material molecules present in the interaction region. In such a precursor material limited regime (e.g., within the Gaussian shaped core region of the beam) the production of the persistent interactions thus becomes saturated with respect to the beam intensity and the production of the persistent interactions depends sub-linearly on beam intensity. In this regime increasing the beam intensity by a factor of two does not increase the production rate of the persistent interactions by a factor of two but by a substantially smaller amount (e.g., only by 10%).

This is not the case in the lower intensity background region of the beam of charged particles, wherein the production of the persistent interaction is not in the precursor material limited regime. In this manner, the persistent interactions produced in the background region of the beam can exhibit a larger relative weight compared to the core region wherein the production of the persistent interactions is limited by the concentration of the precursor material.

As an alternative or in addition thereto, the production of the persistent interactions can also comprise etching part of the surface of the sample. In particular, etching part of the surface of the sample can comprise etching using at least one etching gas.

As an alternative or in addition thereto, the production of the persistent interactions can also comprise the irradiation of a particle-sensitive layer, such as, for example, the irradiation of an electron-sensitive lacquer layer or polymer substrate.

Here, the concentration of the precursor material and/or of the etching gas can be varied depending on the particle current density in some embodiments. As an alternative or in addition thereto, it is likewise possible to vary the irradiation time and/or the particle flux of the beam depending on the particle current density.

By way of example, this renders it possible to ensure that there is a suitable, known and/or controllable functional relationship between the particle current density and the nature of the persistent interactions, said functional relationship, in particular, being able to be substantially linear.

In particular, such a linear relationship between the particle current density and the nature of the persistent interactions can allow the beam profile, i.e., the spatial distribution of the particle current density of the beam, to be deduced directly from the spatial distribution of the persistent interactions.

Therefore, it is also generally of interest to ensure that there is a suitable, known and/or controllable functional relationship between the particle current density and the nature of the persistent interactions, said functional relationship, in particular, being able to be substantially linear.

In some embodiments of the present invention, the spatial distribution of the persistent interactions can be determined by a focused beam of charged particles and/or by a probe for atomic forces and/or by a combination thereof.

In particular, the same particle beam can be used for the purposes of producing the persistent interaction and for determining the spatial distribution of same in a particle-optical system such as a scanning particle microscope, for example. By way of example, the particle beam can be used in a first step to deposit material at a plurality of positions on the surface of a sample. In a second step, the same particle beam then can be focused onto the surface of the sample and the spatial distribution of the deposited material can be detected by scanning the surface of the sample.

A further embodiment of the present invention relates to a method for correcting a beam of charged particles, comprising a method according to any one of the above-discussed embodiments being carried out and at least one beam optical unit of the beam being adapted at least in part on the basis of the at least one determined property of the beam.

By way of example, adapting at least one beam optical unit of the beam in this case can comprise adapting an electromagnetic lens, a condenser diaphragm or aperture and/or an electromagnetic multi-pole.

Here, such a method can further comprise the step of correcting one or more of the following beam properties: an astigmatism, spherical aberrations, chromatic aberrations, a telecentricity error of the beam optical unit, an imaging disturbance of the beam optical unit, a wavefront disturbance and a beam form distortion.

For instance, the step of correcting one or more of the beam properties can comprise scanning the beam of charged particles across one or more components of a beam optical unit, in particular across a diaphragm or an aperture of a beam optical unit such as a condenser.

In this manner, some causes of beam distortions, such as higher order beam aberrations can be removed. For instance, some higher order aberrations may be caused by localized surface charge accumulations on certain components of the beam optics such as a condenser aperture/diaphragm. Scanning the beam of charged particles across such a condenser aperture/diaphragm can result in removing or reducing the surface charge accumulation and thereby also reducing the corresponding stray electric field that may cause the higher order beam aberrations.

For instance, some embodiments can further comprise at least one of the following steps:
 a. focusing the beam of charged particles onto the one or more components of the beam optical unit;
 b. adjusting a condenser unit; or
 c. adjusting a beam deflection unit.

By way of example, a possibly present astigmatism of the beam can be corrected by adapting the coil currents in a multi-pole stigmator.

In particular, the present invention can facilitate carrying out at least the step of producing the persistent interactions, the step of analyzing the spatial distribution of the persistent interaction, the step of deriving the at least one beam property, the step of adapting the at least one beam optical unit and/or the step of correcting the at least one beam property at least in part by way of an electronic data processing apparatus and/or at least partly in automated fashion.

In particular, use can be made here of an iterative method, which can be based at least in part on machine learning. By way of example, use can be made to this end of a neural network, which is configured for the analysis and the categorization of image files and/or microscope images.

The present invention further comprises a computer program comprising instructions for carrying out one of the above-described methods if the instructions are executed by a processor of an electronic data processing apparatus.

The present invention further comprises an apparatus for examining a beam of charged particles, comprising: means for producing persistent interactions of the beam with a sample at a plurality of positions of the sample relative to the beam and means for deriving at least one property of the beam by analyzing the spatial distribution of the persistent interactions at the plurality of positions.

This apparatus can be further embodied to carry out one of the methods discussed above.

The present invention further comprises an apparatus for examining a beam of charged particles, comprising at least one beam optical unit, which is embodied to direct the beam onto a sample at a plurality of positions, at least one material, which is embodied to produce persistent interactions of the beam with the sample, and at least one analyzer, which is embodied to derive at least one property of the beam by analyzing the spatial distribution of the persistent interactions at the plurality of positions.

This apparatus can be further embodied to carry out one of the methods discussed above.

DESCRIPTION OF DRAWINGS

Exemplary embodiments of the present invention will be described below with reference to the accompanying drawings. In the drawings.

DETAILED DESCRIPTION

Below, some exemplary embodiments of the present invention are described in detail using the example of a scanning electron microscope. Here, various feature combinations are described with reference to a few exemplary embodiments of the present invention. By way of example, use is made of a method for the beam-induced deposition of material from the vapor phase. However, the claimed methods, apparatuses and computer program for examining a beam of charged particles are not restricted to such embodiments. Rather, it should be understood that other feature combinations can also fall under the scope of protection of the invention. Expressed differently, not all features of the described embodiments need to be present in order to realize the present invention. Moreover, the embodiments can be modified by combining certain features of one embodiment with one or more features of another embodiment, without deviating from the disclosure and the scope of protection of the present invention.

In particular, the present invention is not restricted to electron microscopes but can also be applied to a multiplicity of particle-optical systems, such as: Scanning electron and scanning ion microscopes, transmission electron and transmission ion microscopes, electron beam lithography systems, ion beam lithography systems and x-ray microscopes.

Figure 1:
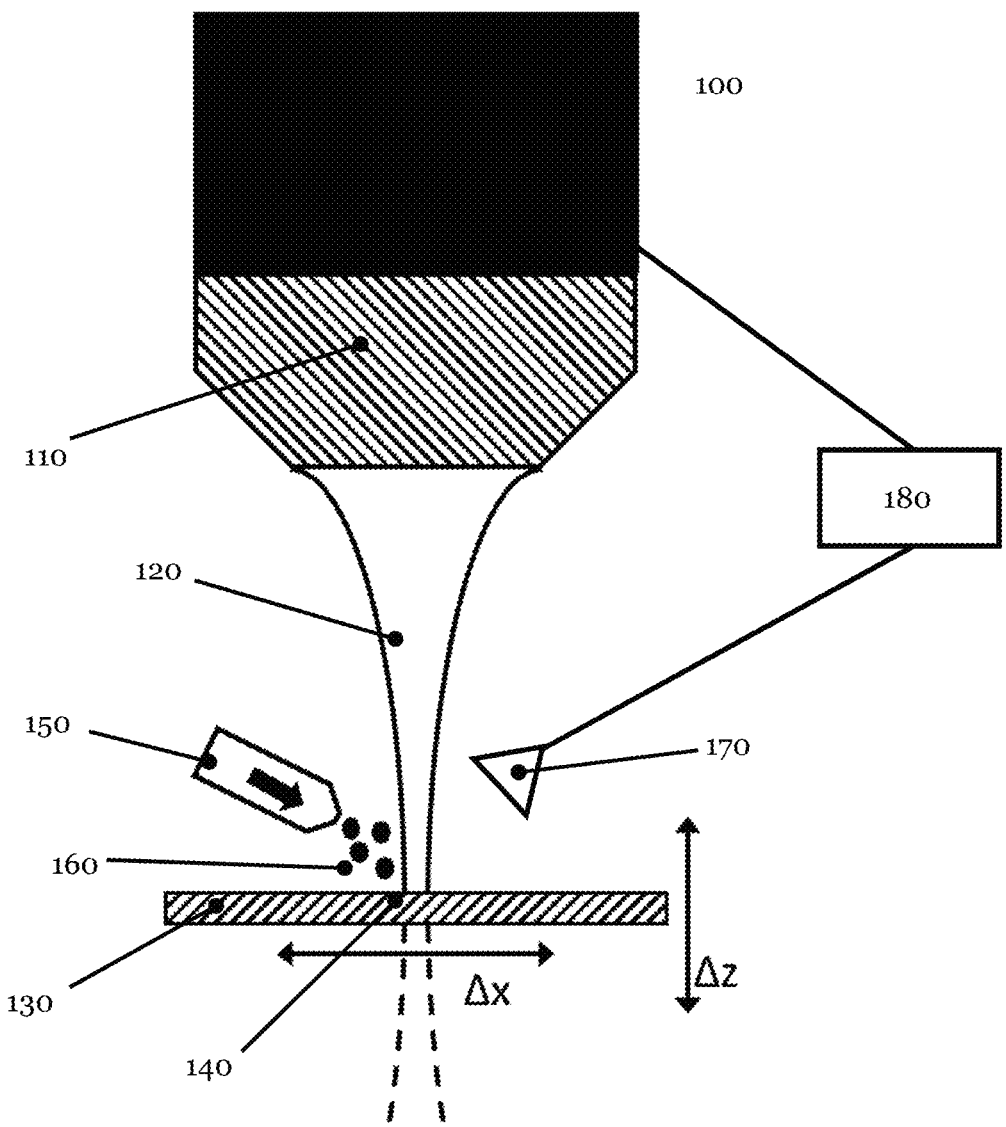
FIG. 1 shows a schematic longitudinal section through part of a particle-optical apparatus, which is suitable to carry out a method according to the present invention.

FIG. 1 shows a schematic longitudinal section through part of a scanning electron microscope (SEM) 100, which is suitable to carry out a method according to the present invention. Here, a column 110 comprises different electron or beam optical units, which are configured to focus an electron beam 120 and direct the latter onto a sample 130. Here, the electron beam is produced by a source such as an electron gun (not shown) at the upper end of the column 110 and beam-formed by a condenser assembly (not shown) consisting of at least one condenser coil and a condenser diaphragm/aperture. Here, the column 110 can comprise further beam optical units such as, for example, further electromagnetic lenses, further apertures/diaphragms, electromagnetic multi-poles for correcting beam errors and the like, which are suitable for manipulating and aligning the electron beam 120.

In particular, the column 110 can be configured to displace the focal position 140 of the electron beam 120 relative to the surface of the sample 130. By way of example, the electron beam is focused onto the surface of the sample 130 by adjusting the position in the z-direction and part of the surface of the sample 130 is subsequently scanned by systematic displacement of the focal position 140 in the x-direction and y-direction in order to produce an electron-optical image of the surface of the sample 130 during the normal operation of the SEM 100.

To this end, the illustrated SEM 100 can comprise at least one detector 170 and a data processing apparatus 180, which together are embodied to produce a scanned image of the surface of the sample 130 that was scanned by the electron beam 120. By way of example, the detector can be embodied to detect backscattered primary electrons and/or secondary electrons. As an alternative or in addition thereto, use can also be made of a detector that is arranged in the beam path of the electron beam in the column 110. Further, the data processing apparatus 180 can be embodied to actuate, control and/or adjust the beam optical units of the SEM 100.

Here, the sample 130 is arranged on a sample stage, which can be likewise adjustable. In particular, the sample stage can have one or more piezoelectric actuators that allow the sample 130 to be displaced relative to the electron beam 120.

The illustrated SEM 100 further comprises an application apparatus 150 for at least a precursor gas and/or an etching gas 160, which is suitable for producing a persistent interaction of the electron beam 120 with part of the surface of the sample 130. By way of example, tetraethyl orthosilicate (TEOS) can be used as precursor gas, the latter allowing $SiO_2$ to be deposited in targeted fashion on the surface of the sample 130 by way of the electron beam. In particular, the electrons of the beam 120 produce secondary electrons, inter alia, by scattering processes with the atoms and/or the lattice structure of the sample 130, said secondary electrons, in turn, being able to interact with the molecules of the precursor gas 160 and thus leading to the deposition of material such as, e.g., $SiO_2$, on the surface of the sample 130. The process of the beam-induced deposition of material from the vapor phase is also referred to as beam-induced deposition of deposits.

Similarly, the introduction of various etching gases 160 by the application apparatus 150 allows a targeted removal of material from the surface of the sample 130.

A detailed description of the beam-induced deposition of material on a surface of the sample 130 can be gathered from the earlier application WO 2012/146647 A2 by the applicant.

The SEM 100 facilitates, inter alia, the production of deposits and/or etchings at different positions of the surface of the sample 130 and, in the process, likewise the targeted adjustment of the distance between the surface of the sample 130 and the focal position 140 of the beam 120 in the propagation direction. In particular, the beam can be defocused in such a way that the surface of the sample 130 is positioned in the far field of the focus of the beam 120, this simplifying or even only making possible the derivation of various beam properties as described above.

Figure 2:
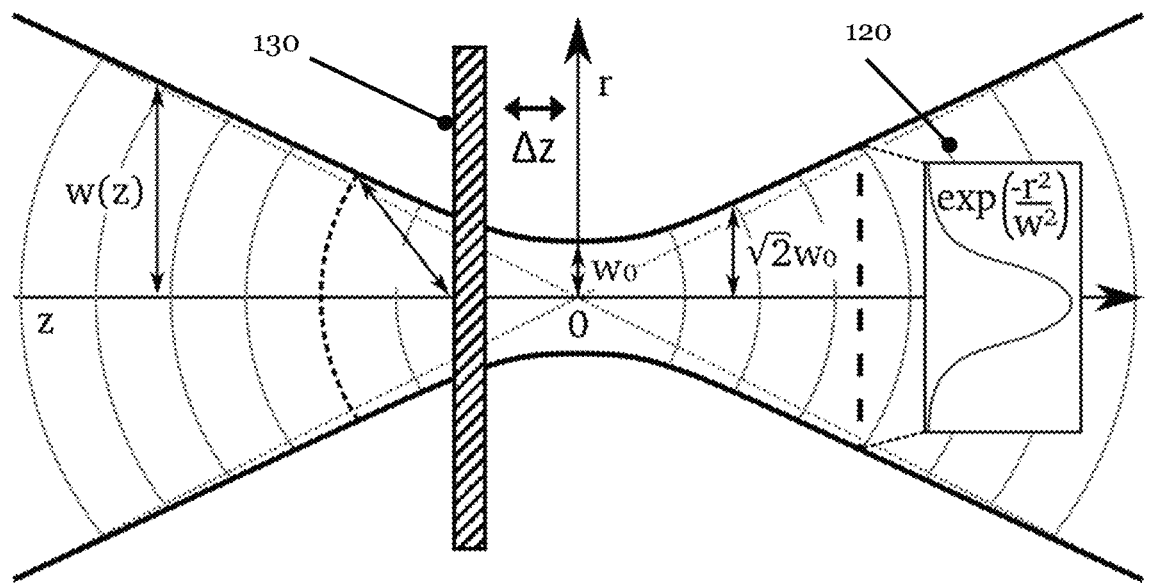
FIG. 2 shows a schematic longitudinal section through part of the beam path of a particle-optical apparatus, which is suitable to carry out a method according to the present invention.

FIG. 2 shows a further schematic longitudinal section through the focused electron beam 120 and the sample 130 from FIG. 1. Here, the electron beam 120 is illustrated in idealized fashion as a so-called Gaussian beam. Here, such a Gaussian beam has a beam profile that is substantially described by a Gaussian function. Here, the full width at half maximum w of this Gaussian function is a function w(z) of the distance z from the focal position at z=0 in the propagation direction. Here, the minimum width of the beam at the focus is denoted w(0).

The relative distance $\Delta z$ between focal position and sample can be adjusted by adjusting the focal position in the z-direction and/or by adjusting the position of the sample 130. Here, increasing the distance $\Delta z$ also leads to an increase in the beam width w on the surface of the sample 130. Here, the maximum particle current density in the center of the beam 120 reduces when the distance $\Delta z$ is increased. Typically, the rate of production of secondary electrons per unit area in the sample 130 depends on the particle current through this unit area. By way of example, the rate of production of secondary electrons can be proportional to the particle current through this unit area of the surface of the sample 130.

It is evident to a person skilled in the art that the beam profile illustrated in FIG. 2 is a theoretical idealization and does not represent a real, physical electron beam 120 of an SEM 100 or the particle beam of any other particle-optical system.

Figure 3:
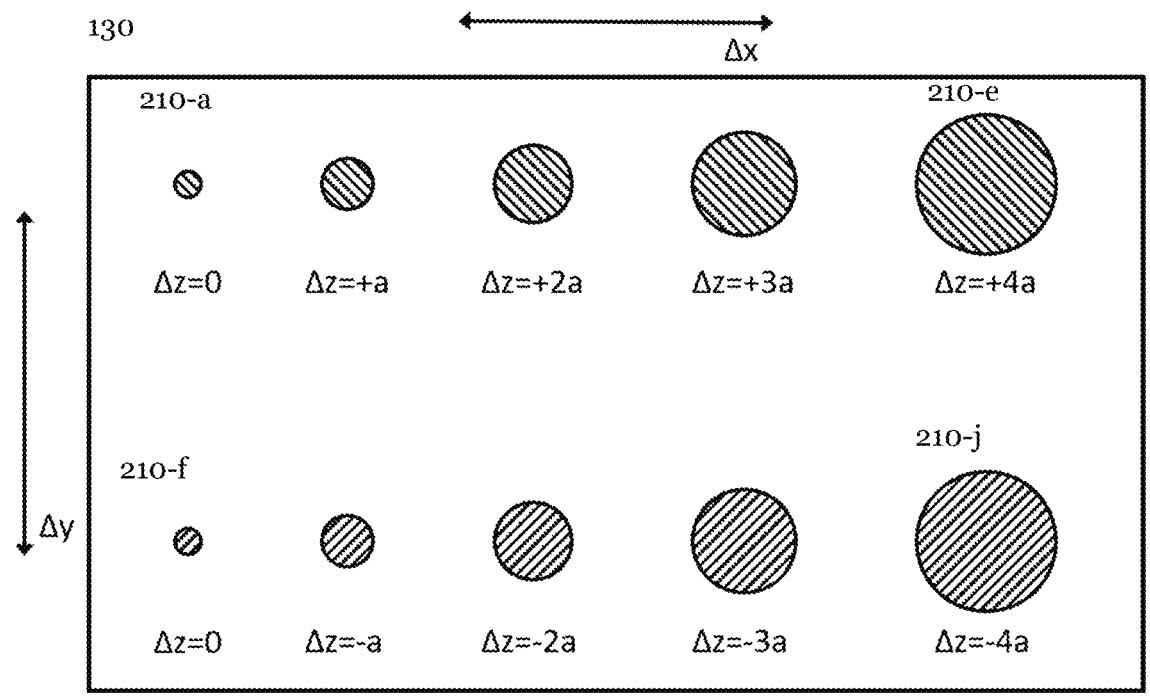
FIG. 3 shows a schematic plan view of a sample, which is suitable to be used in a method according to the present invention.

In a schematic fashion, FIG. 3 shows an example for how the above-discussed apparatus 100 can be used to systematically examine the electron beam 120 of the SEM 100 and how certain properties of the beam 120 can be derived thereby.

A rectangular portion of a sample 130 is shown. A multiplicity of persistent interactions can be produced on the surface of the sample 130 by way of systematic displacement of the focal position in the x, y and z-direction. By way of example, as described above, beam-induced deposition of material from the vapor phase can be used to deposit a deposit 210 on the surface of the sample 130 for each focal position $\Delta z$.

The spatial distribution of the respective deposit 210 can be determined, at least in part, by the beam profile of the electron beam 120. By way of example, the process parameters such as the electron flux and/or the concentration of the precursor gas can be adjusted for the production of each of the deposits 210 in such a way that a substantially linear relationship sets in between the particle current density of the beam 120 and the deposition rate of the respective deposit 210. In this way, it is possible to produce deposits 210 on the surface of the sample 130, the spatial distribution of which is directly related to the beam profile of the electron beam 120.

The sample 130 can be measured after the deposits 210 were deposited on the surface of the sample 130. By way of example, the sample 130 can be measured using the electron beam 120 of the SEM 100. To this end, the beam is focused on the surface of the sample 130 and the relevant part of the surface of the sample 130 is scanned in order to produce an SEM image of the deposits 210, for example by detecting primary and/or secondary electrons. The image of the deposits 210 obtained can now be evaluated and the spatial distribution of the deposits 210 can be analyzed in order to derive certain properties of the beam 120.

Figure 4:
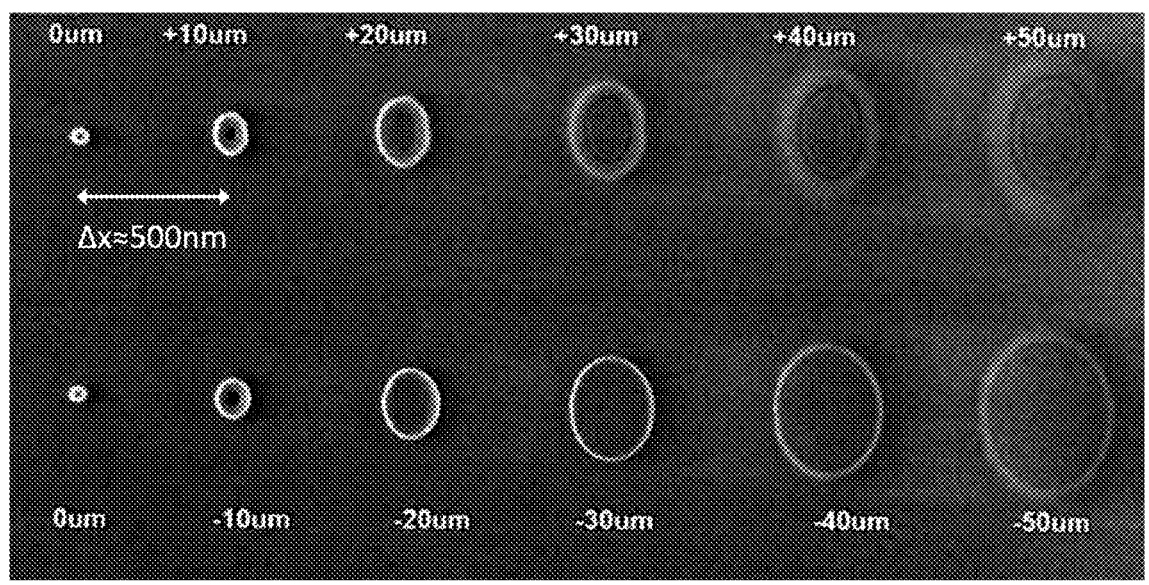
FIG. 4 shows a recording of a sample, by use of a scanning electron microscope, according to a method of the present invention, comprising a plurality of material depositions at different distances from a focal position.

FIG. 4 shows an SEM image of a plurality of deposits 210-$a$-210-$j$ on the surface of a sample 130, which were produced at different defocusing settings and detected using the same electron beam 120, which also induced the formation of deposits. What can clearly be identified here from the image of FIG. 4 is that the spatial distribution of the deposits is correlated with the beam profile of the focused electron beam 120 of the SEM 100. In particular, the spatial distribution of the deposits with defocus settings $|z| \geq 30$ m allows the beam profile of the electron beam 120 of the SEM 100 to be deduced directly. In the case of smaller defocus settings |z|≤10 μm, a gas depletion of the precursor gas 160 in the center of the electron beam 120 leads, in the shown example, to the respective deposit having a ring structure, which does not correspond, or only corresponds inaccurately, to the actual beam profile of the electron beam 120.

Now, some properties of the electron beam 120 of the SEM 100 can be deduced directly from the spatial distribution of the deposits 210. By way of example, it is possible to identify that the beam profile is not round but elliptical. The numerical aperture (NA) of the electron beam can be deduced directly from the semi-radii R=R(z) of the elliptical beam profile at different defocus settings z by way of the relationship NA=dR/dz. If, additionally, the mean de Broglie wavelength $\lambda=h/\sqrt{2m_e E_{Kin}}$ of the electron beam 120 is known, the lateral δx~λ/NA and axial resolution limit δz~λ/NA² of the SEM can be additionally predicted from the numerical aperture. Here, $m_e$ denotes the rest mass of the electron and $E_{Kin}$ denotes the mean kinetic energy of the electrons of the electron beam 120.

Further, concentric ring structures are identified in the deposit at the positive defocus settings of +20 μm to +50 μm, which are not present in the corresponding negative defocus settings of −20 μm to −50 μm. From this, the presence of positive spherical aberrations in the electron beam can be deduced.

A quantitative analysis of the image aberrations can also be carried out on the basis of such a series of deposit images, which were recorded with a systematically varied defocus setting, in the case of a sufficiently high signal-to-noise ratio of the SEM image of the deposits. To this end, methods such as the Zernike analysis or the apodization, which are known for example from light optics, can be used. Such a series of deposit images can also be referred to as a defocus stack or focus stack.

The beam-induced deposition process used to produce the deposits in FIG. 4 generally depends on various parameters in nonlinear fashion. In particular, the concentration of the precursor gas and the particle current density of the electron beam are relevant here. By way of example, a particle current density that is too high can lead to the precursor gas not diffusing, or only insufficiently diffusing, into the center of the electron beam, possibly leading to a gas depletion in the center. Now, this effect can lead to the spatial distribution of the deposit no longer being directly correlated to the beam profile of the electron beam. In order to counteract this effect and other saturation phenomena when forming the deposits, it is possible to adapt the process parameters such as concentration of the precursor molecule, the electron flux of the electron beam and/or the irradiation time as a function of the defocus setting in order to ensure a correlation that is as direct as possible between the spatial arrangement of the respective deposit and the beam profile of the electron beam. In particular, it can be advantageous here to set the process parameters in such a way that the thickness of the deposit is substantially directly proportional to the electron current density of the beam. In this case, the respective deposit 210 facilitates a direct measurement of the associated beam profile of the electron beam 120.

Figure 5:
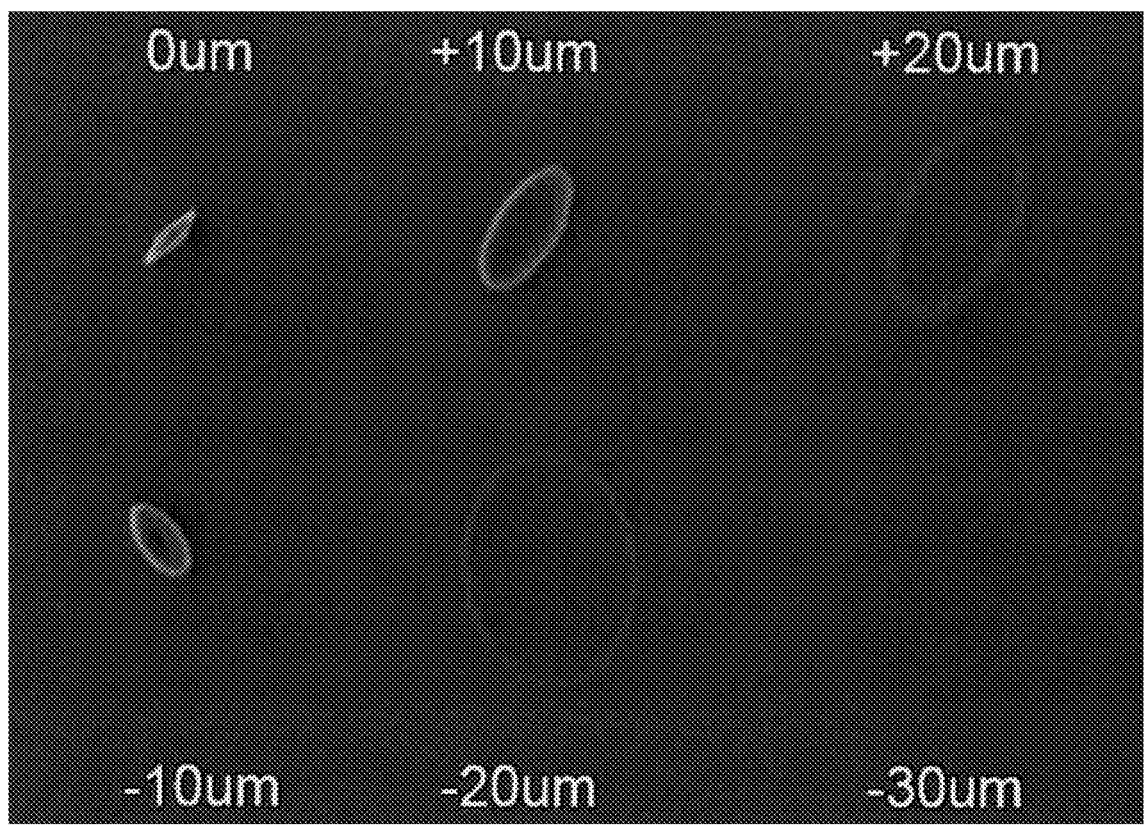
FIG. 5 shows a recording of a sample, by use of a scanning electron microscope, according to a method of the present invention, comprising a plurality of material depositions at different distances from a focal position.

FIG. 5 shows a further SEM image of a defocus stack of deposits. In this example, a strongly elliptical beam profile can be deduced from the spatial distributions of the deposits. Additionally, the alignment of the ellipse rotates through substantially 90° during the passage through the focus at z=0 μm. Such behavior of the beam profile allows the presence of an astigmatism of the electron beam 120 to be deduced directly. Since the radii of the principal axes of the ellipse in this case are not minimal (i.e., have their focus) at the same value of z, such an astigmatism leads, as a rule, to an increase in the effective focal dimension of the electron beam 120.

The nature of the astigmatism can be analyzed quantitatively in the case of a sufficiently high signal-to-noise ratio of the SEM images of the deposits. Now, the beam optical unit of the SEM 100 can be adjusted in such a way on the basis thereof that the astigmatism of the electron beam 120 can be corrected. By way of example, a quadrupole stigmator or any other suitable compensation optical unit of the column 110 can be used to correct a present astigmatism.

Figure 6:
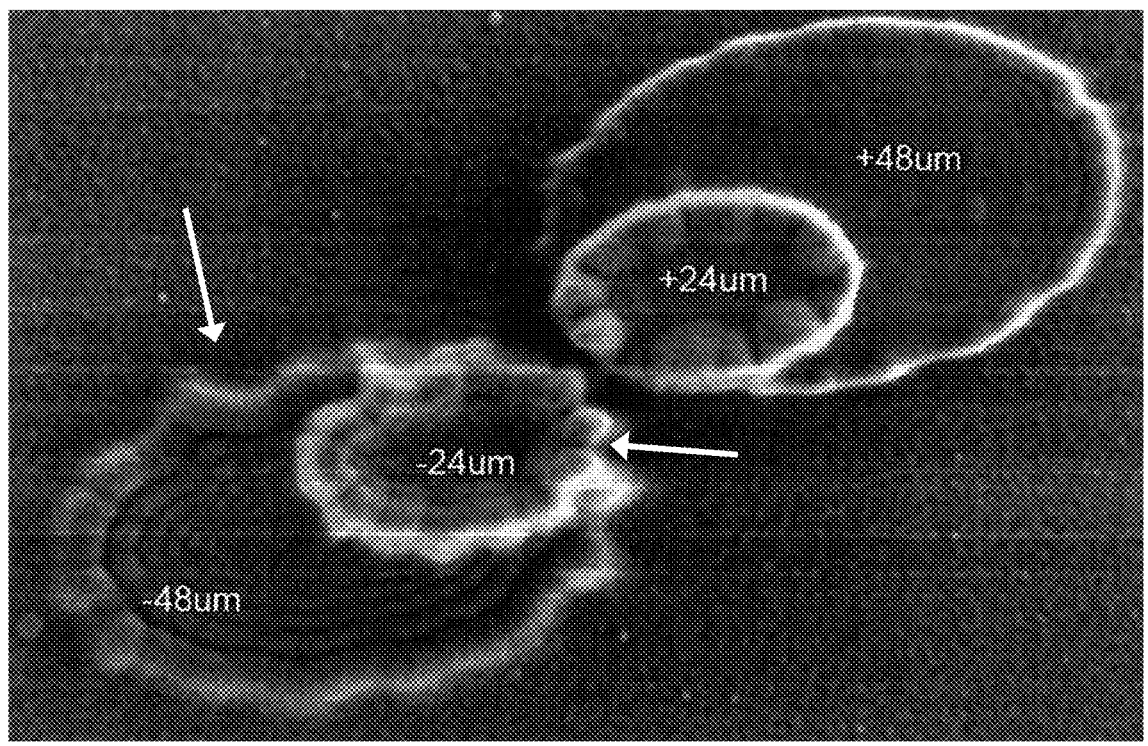
FIG. 6 shows a recording of a sample, by use of a scanning electron microscope, according to a method of the present invention, comprising a plurality of material depositions at different distances from a focal position.

FIG. 6 shows a further SEM image of a defocus stack of deposits. In contrast to the SEM images of FIGS. 4 and 5, the lateral position of the electron beam 120 was kept constant in relation to the sample 130 in FIG. 6. The migration of the spatial distribution of the deposits between the various deposits can be traced back, for example, to incomplete wobbling of the condenser diaphragm/aperture of the SEM 100. In the case of a fixed or known setting of the lateral spacing between the deposits, the remaining telecentricity error of the electron beam can be directly deduced from the measured lateral offset of the deposits in relation to the fixed or known lateral spacing. In a manner similar to the above-described correction of an astigmatism, the condenser diaphragm/aperture can be adjusted in order to remove, or at least significantly reduce, a present telecentricity error.

Further, fringes (see arrows) in the spatial distribution of the deposits can be determined on the deposits in FIG. 6. These fringes or irregularities of the deposits, and hence of the beam profile of the electron beam 120, allow the presence of imaging disturbances of the beam optical unit to be deduced. By way of example, such imaging disturbances may be caused by local charging or surface charging of the SEM, and these have a negative influence on the ability to focus the electron beam 120, and hence on the minimal focal dimension thereof. Such degradations of the imaging power of the SEM are not directly visible in, or near, the focus (for example, within the depth of field of the SEM). However, if deposits are recorded in the far field of the focus (e.g., at z>5-times the depth of field), such beam form distortions can easily be identified and can be remedied in a targeted manner where necessary. By way of example, the location of the imaging disturbance responsible for the beam form distortion, e.g., the location of a surface charge, can be deduced from the defocus dependence of the beam form distortion.

In general, it should be noted that beam aberrations can be analyzed and remedied significantly more easily with the aid of the deposits deposited with the defocused electron beam than what is possible by analyzing the focused beam.

In particular, the method illustrated in FIGS. 3-6 can easily be automated. By way of example, a full defocus stack of deposits, as shown schematically in FIG. 3, can be produced in a few minutes and can be detected and evaluated using the same particle beam or any other suitable method.

As a result, it can be possible not only to systematically analyze the relevant beam properties of a given particle-optical system but also to automatically remedy the latter by way of suitable feedback to the respective beam optical units and/or dedicated compensation components. In particular, use can be made here of linear, nonlinear and/or stochastic optimization algorithms, machine learning and/or neural networks, which are configured for the analysis and categorization of image data. Such a method can now permit the characterization, adjustment and/or calibration of a given particle-optical system in a partially or fully automated manner before the actual operation is started or continued.

Figure 7:
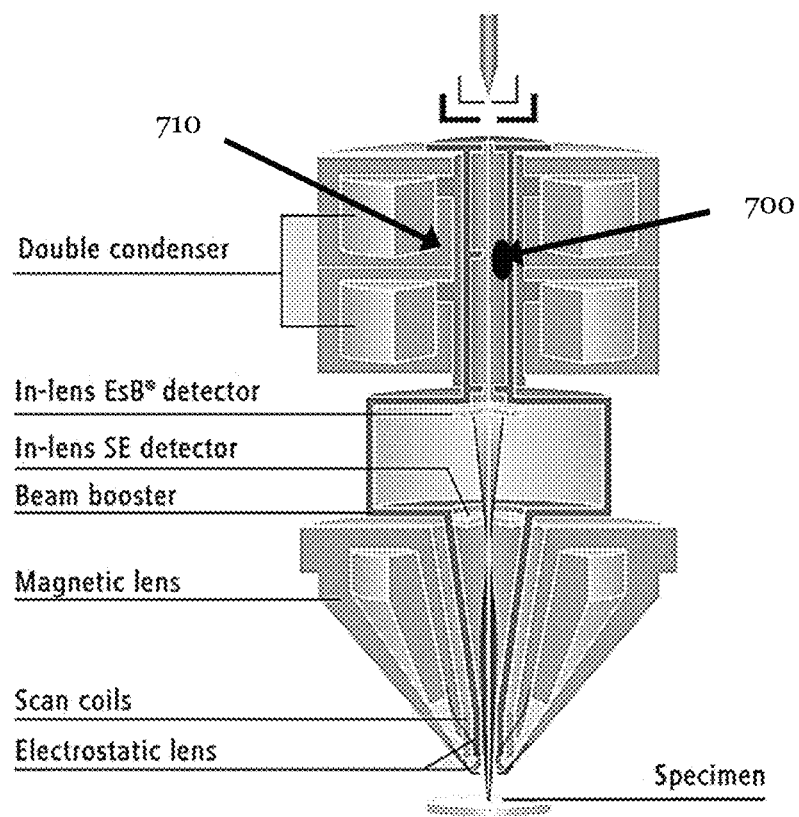
FIG. 7 illustrates a typical beam optical device being affected by a localized surface charge accumulation resulting in higher order beam aberrations.

FIG. 7 illustrates a typical beam optical device being affected by a localized surface charge accumulation 700 that can result in higher order beam aberrations. For instance, the localized surface charge accumulation 700 can be present in the vicinity of a condenser aperture or diaphragm 710 of the beam optical device. The localized surface charge accumulation 700 can produce electrical stray fields that may interfere with the operation of the beam optical device. For instance, such stray electric fields may result in higher order beam aberrations such as illustrated in FIG. 9 below.

Figure 8:
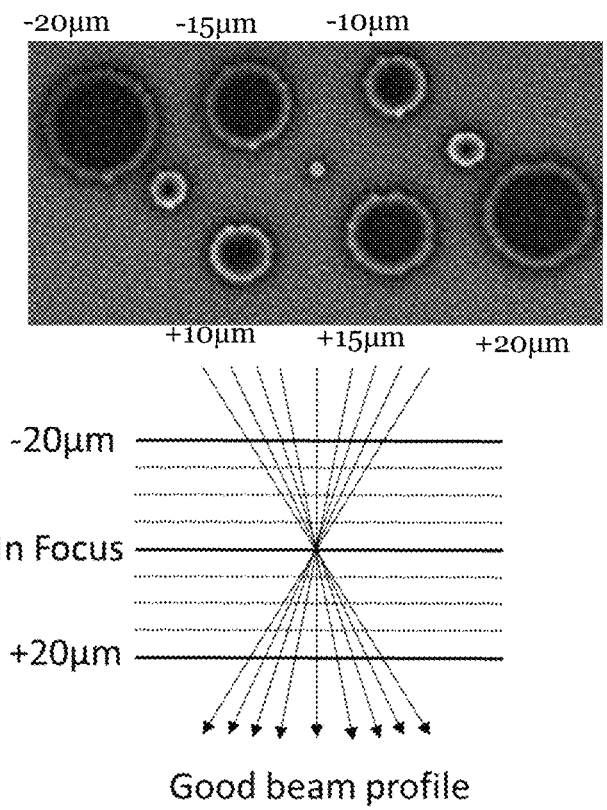
FIG. 8 shows a recording of a sample, by use of a scanning electron microscope, according to a method of the present invention, comprising a plurality of material depositions at different distances from a focal position without higher order beam aberrations caused by a localized surface charge accumulation.

FIG. 8 shows a recording of a sample, by use of a scanning electron microscope, according to a method of the present invention, comprising a plurality of material depositions at different distances (e.g., −20 µm, −15 µm, . . . , +15 µm, +20 µm) from a focal position without higher order beam aberrations such as aberrations caused by a localized surface charge accumulation on a beam optical element such as a condenser diaphragm of aperture.

Figure 9:
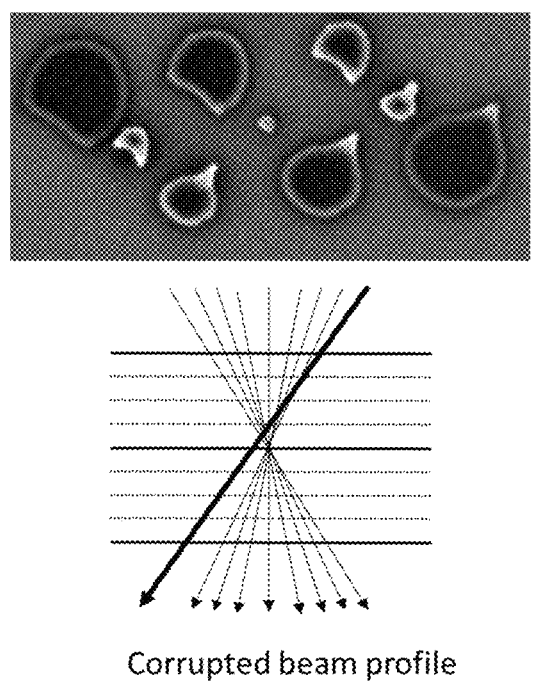
FIG. 9 shows a recording of a sample, by use of a scanning electron microscope, according to a method of the present invention, comprising a plurality of material depositions at different distances from a focal position with higher order beam aberrations caused by a localized surface charge accumulation.

FIG. 9 shows a recording of a sample, by use of a scanning electron microscope, according to a method of the present invention, comprising a plurality of material depositions at different distances (e.g., −20 µm, −15 µm, . . . , +15 µm, +20 µm) from a focal position with higher order beam aberrations 800 that for example may be caused by a localized surface charge accumulation on a beam optical element such as a condenser diaphragm of aperture.

Figure 10:
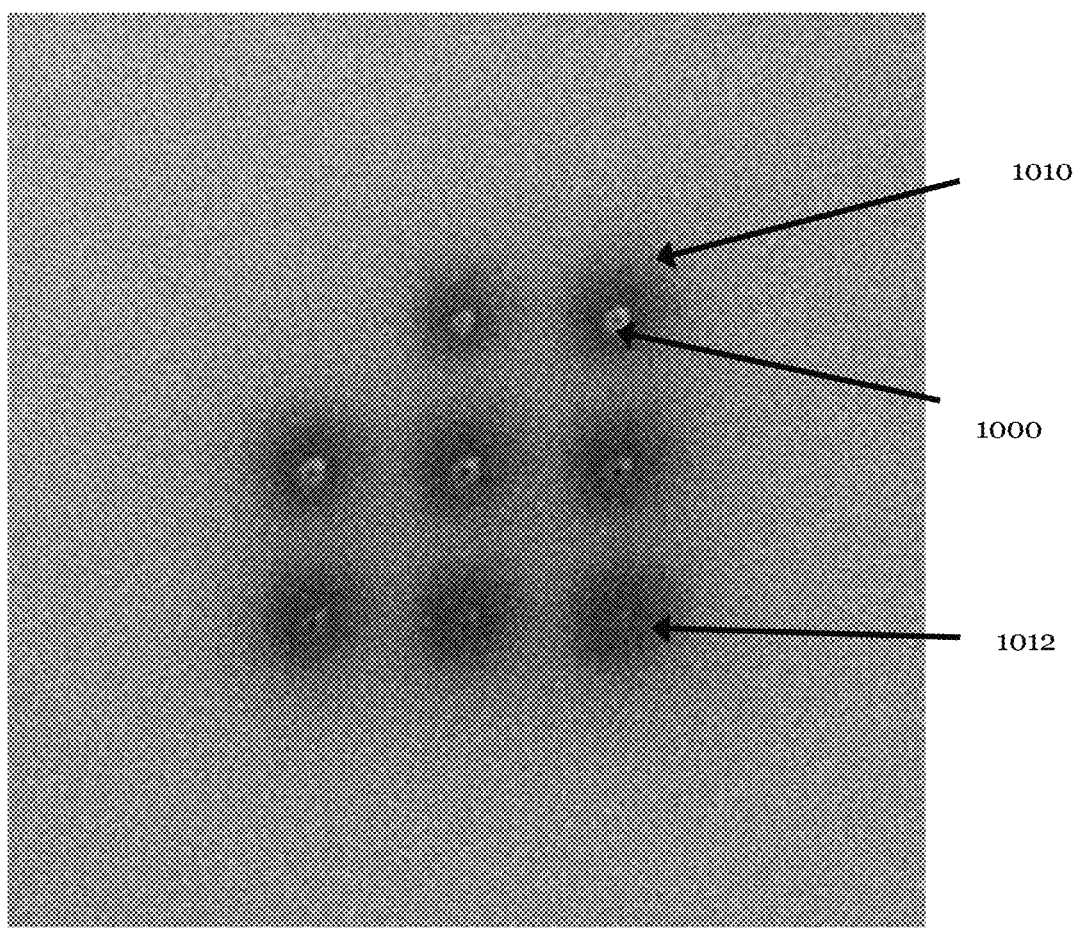
FIG. 10 shows a recording of a sample, by use of a scanning electron microscope, according to a method of the present invention, comprising a plurality of material depositions, deposited via varying the concentration of a precursor material for the deposition.

FIG. 10 shows a recording of a sample, by use of a scanning electron microscope, according to a method of the present invention, comprising a plurality of material depositions, deposited at different positions on a surface of a sample while varying the concentration of a precursor material for the deposition. Two different regions of the deposition can be identified. A large diameter background region 1010 surrounds a high intensity core region 1000 of the deposition. The high intensity core region 1000 corresponds to the high-intensity core region of the beam of charged particles.

When the concentration of the precursor material is reduced the core region 1000 becomes less pronounced in the recording due to depletion of the precursor material in the core region. In other words, the deposition becomes saturated in the core region with respect to the beam intensity. Alternatively or additionally, to reducing the concentration of the precursor material, also the beam intensity can be increased in order to enter the saturation region which essentially depends on the ratio of the precursor material concentration and the beam intensity.

This effect can be used to reduce the large difference in contrast between the core region 1000 and the background region 1010 as can be seen from the last deposition 1012 which is recorded at the lowest level of concentration of the precursor material.

In this manner, the analysis of the undesired background region 1010 is enhanced and potential causes for the background region 1010 can better be determined and removed, e.g. via scanning the beam of charged particles across a condenser aperture of the beam and/or adjusting the beam optics of the beam.

While above the idea to increase the contrast for the low-intensity background region 1010 is described in the context of beam induced deposition of a precursor material, this aspect of the present invention is not limited to this special way of producing persistent interactions between a beam of charged particles and a sample. Other interaction mechanisms such as beam induced etching and/or directly modifying the sample with the beam are also covered. In other words, the general idea of entering a saturation regime of the production of the persistent interactions with respect to beam intensity can be applied to all kinds of interaction mechanisms.

What is claimed is:

1. A method for examining a beam of charged particles, including the following steps:
   a. producing persistent interactions of the beam with a sample at a plurality of positions of the sample relative to the beam, in which the persistent interactions comprise beam-induced deposition of material from vapor phase onto a part of the surface of the sample, the deposited material being obtained from at least one precursor material; and
   b. deriving at least one property of the beam by analyzing the spatial distribution of the persistent interactions at the plurality of positions,
   wherein at least some of the plurality of positions of the sample are arranged at different points in the direction of propagation of the beam by adjusting the position of the sample while keeping beam optics parameters constant;
   wherein producing the persistent interactions further comprises varying one or more parameters of the beam-induced deposition of material to cause the deposition of material to become saturated with respect to a beam intensity in a core region of the beam of charged particles by performing at least one of:
   (i) increasing the intensity of the beam of charged particles;
   (ii) changing an interaction duration of the beam with the sample;
   (iii) reducing an amount of the at least one precursor material provided to the part of the surface of the sample to reduce the concentration of the at least one precursor material at the part of the surface of the sample; or
   (iv) depleting the precursor material in the core region of the beam.

2. The method of claim 1, wherein the at least one property comprises one or more of the following properties:
   a. a numerical aperture;
   b. a magnification scale;
   c. a beam profile;
   d. an imaging disturbance;
   e. a wavefront disturbance;
   f. an astigmatism;
   g. a spherical aberration;
   h. a chromatic aberration;
   i. a telecentricity error of the beam optical unit;
   j. a beam form distortion; and
   k. a higher order beam aberration.

3. The method of claim 1, wherein at least some of the plurality of positions are arranged at different points orthogonal to the direction of propagation of the beam.

4. The method of claim 1, wherein the beam is a focused beam.

5. The method of claim 1, wherein the plurality of positions are adjusted at least in part by a change in a focal position of the beam.

6. The method of claim 4, wherein at least some of the plurality of the positions lie in the far field of the focus of the beam.

7. The method of claim 1, wherein the analysis of the spatial distribution of the persistent interactions comprises the determination of at least part of a beam profile.

8. The method of claim 1, wherein the analysis of the spatial distribution of the persistent interactions comprises at least one of the following steps:
   a. estimating the length of a semi-major and/or semi-minor axis of the beam profile;
   b. estimating an angle between the semi-major and/or semi-minor axis of the beam profile in relation to a reference direction;
   c. estimating the position of the centroid of the beam profile relative to the position of a reference point;
   d. estimating an intensity value at the centroid of the beam profile; or
   e. estimating a mean intensity of the beam profile.

9. The method of claim 1, wherein the persistent interactions comprise persistent changes of a part of the surface of the sample.

10. The method of claim 1, wherein the step of producing the persistent interactions comprises depleting the precursor material in the core region of the beam of charged particles.

11. The method of claim 1, wherein the persistent interactions comprise etching of the part of the surface of the sample.

12. The method of claim 1, wherein the spatial distribution of the persistent interactions is determined by a focused beam of the charged particles and/or by a probe for atomic forces and/or by a combination thereof.

13. A method for correcting a beam of charged particles, comprising:
   a. carrying out the method of claim 1; and
   b. adapting at least one beam optical unit of the beam at least in part on the basis of the at least one determined property of the beam.

14. The method of claim 13, wherein the at least one beam optical unit comprises one or more of the following components:
   a. an electromagnetic lens;
   b. a condenser diaphragm or aperture;
   c. an electromagnetic multi-pole.

15. The method of claim 13, further comprising the step of correcting one or more of the following beam properties:
   a. an astigmatism;
   b. a spherical aberration;
   c. a chromatic aberration;
   d. a telecentricity error of the beam optical unit;
   e. an imaging disturbance;
   f. a wavefront disturbance;
   g. a beam form distortion; and
   h. a higher order beam aberration.

16. The method of claim 15, wherein the step of correcting one or more of the beam properties comprises scanning the beam of charged particles across one or more components of a beam optical unit, in particular across a diaphragm or an aperture of a beam optical unit or a condenser.

17. The method of claim 16, further comprising at least one of:
   a. focusing the beam of charged particles onto the one or more components of the beam optical unit;
   b. adjusting a condenser unit; or
   c. adjusting a beam deflection unit.

18. A non-volatile machine-readable medium storing a computer program comprising instructions for carrying out the method of claim 1 when the instructions are carried out by a processor of an electronic data processing apparatus.

19. The method of claim 1 wherein the at least one property comprises at least one of a numerical aperture, a magnification scale, or a beam profile.

20. The method of claim 1 wherein the at least one property comprises at least one of an imaging disturbance, a wavefront disturbance, or an astigmatism.

21. The method of claim 1 wherein the at least one property comprises at least one of a spherical aberration, a chromatic aberration, a telecentricity error of the beam optical unit, or a higher order beam aberration.

22. The method of claim 1 wherein the step of producing the persistent interactions comprises increasing the intensity of the beam of charged particles to cause the deposition of material to become saturated with respect to the beam intensity in the core region of the beam of charged particles.

23. The method of claim 1 wherein the step of producing the persistent interactions comprises changing the interaction duration of the beam with the sample to cause the deposition of material to become saturated with respect to the beam intensity in the core region of the beam of charged particles.

24. The method of claim 1 wherein the step of producing the persistent interactions comprises reducing the amount of the at least one precursor material provided to the part of the surface of the sample to reduce the concentration of the at least one precursor material at the part of the surface of the sample to cause the deposition of material to become saturated with respect to the beam intensity in the core region of the beam of charged particles.

25. The method of claim 1 wherein the step of producing the persistent interactions comprises depleting the precursor material in the core region of the beam of charged particles to cause the deposition of material to become saturated with respect to the beam intensity in the core region of the beam of charged particles.

26. The method of claim 1 wherein when the deposition of material becomes saturated with respect to the beam intensity, increasing the beam intensity by a factor of two causes a production rate of the deposition of material to increase by at most 10%.

27. The method of claim 1 wherein in a lower intensity background region outside of the core region of the beam of charged particles, the deposition of material is not saturated with respect to the beam intensity.

28. An apparatus for examining a beam of charged particles, comprising:
   a. means for producing persistent interactions of the beam with a sample at a plurality of positions of the sample relative to the beam, in which the persistent interactions comprise beam-induced deposition of material from vapor phase onto a part of the surface of the sample, the deposited material being obtained from at least one precursor material; and
   b. means for deriving at least one property of the beam by analyzing the spatial distribution of the persistent interactions at the plurality of positions,
   wherein at least some of the plurality of positions of the sample are arranged at different points in the direction of propagation of the beam by adjusting the position of the sample while keeping beam optics parameters constant;
   wherein producing the persistent interactions further comprises varying one or more parameters of the beam-induced deposition of material to cause the deposition of material to become saturated with respect to a beam intensity in a core region of the beam of charged particles by performing at least one of:
      (i) increasing the intensity of the beam of charged particles;

(ii) changing an interaction duration of the beam with the sample;
(iii) reducing an amount of the at least one precursor material provided to the part of the surface of the sample to reduce the concentration of the at least one precursor material at the part of the surface of the sample; or
(iv) depleting the precursor material in the core region of the beam.

29. The apparatus of claim 28, wherein the apparatus is embodied to carry out a method of claim 1.

30. An apparatus for examining a beam of charged particles, comprising:
   a. at least one beam optical unit, which is embodied to direct the beam onto a sample at a plurality of positions;
   b. at least one material, which is embodied to produce persistent interactions of the beam with the sample, in which the persistent interactions comprise beam-induced deposition of material from vapor phase onto a part of the surface of the sample, the deposited material being obtained from at least one precursor material; and
   c. at least one analyzer, which is embodied to derive at least one property of the beam by analyzing the spatial distribution of the persistent interactions at the plurality of positions,
   wherein at least some of the plurality of positions of the sample are arranged at different points in the direction of propagation of the beam by adjusting the position of the sample while keeping beam optics parameters constant;
   wherein the apparatus is configured to produce the persistent interactions by varying one or more parameters of the beam-induced deposition of material to cause the deposition of material to become saturated with respect to a beam intensity in a core region of the beam of charged particles in a way that includes at least one of:
     (i) increase the intensity of the beam of charged particles;
     (ii) change an interaction duration of the beam with the sample;
     (iii) reduce an amount of the at least one precursor material provided to the part of the surface of the sample to reduce the concentration of the at least one precursor material at the part of the surface of the sample; or
     (iv) deplete the precursor material in the core region of the beam.

31. The apparatus of claim 30, wherein the apparatus is embodied to carry out a method of claim 1.

32. A method for examining a beam of charged particles, the method comprising:
   producing persistent interactions of the beam with a sample at a plurality of positions of the sample relative to the beam, wherein the persistent interactions comprise beam-induced etching of a part of the surface of the sample using at least one etching gas, and varying one or more parameters of the beam-induced etching to cause the beam-induced etching of the part of the surface of the sample to become saturated with respect to a beam intensity in a core region of the beam of charged particles; and
   deriving at least one property of the beam by analyzing the spatial distribution of the persistent interactions at the plurality of positions;
   wherein at least some of the plurality of positions of the sample are arranged at different points in the direction of propagation of the beam by adjusting the position of the sample while keeping beam optics parameters constant.

33. The method of claim 32 wherein varying one or more parameters of the beam-induced etching comprises performing at least one of:
   (i) increasing the intensity of the beam of charged particles;
   (ii) changing an interaction duration of the beam of charged particles with the sample;
   (iii) reducing an amount of the at least one etching gas provided to the part of the surface of the sample to reduce the concentration of the at least one etching gas at the part of the surface of the sample; or
   (iv) depleting the etching gas in the core region of the beam of charged particles.

34. The method of claim 32 wherein when the beam-induced etching of material becomes saturated with respect to the beam intensity, increasing the beam intensity by a factor of two causes a production rate of the etching to increase by at most 10%.

35. The method of claim 32 wherein in a lower intensity background region outside of the core region of the beam of charged particles, the beam-induced etching of material is not saturated with respect to the beam intensity.

36. A method for examining a beam of charged particles, the method comprising:
   producing persistent interactions of the beam with a sample at a plurality of positions of the sample relative to the beam, in which the persistent interactions comprise at least one of (i) direct modification of a part of the surface of the sample to cause persistent changes at the part of the surface of the sample, (ii) beam-induced deposition of material from vapor phase onto a part of the surface of the sample, or (iii) etching of a part of the surface of the sample using at least one etching gas;
   wherein producing the persistent interactions comprises varying one or more parameters of the persistent interactions to cause the persistent interactions of the beam with the sample to become saturated with respect to a beam intensity in a core region of the beam of charged particles; and
   deriving at least one property of the beam by analyzing the spatial distribution of the persistent interactions at the plurality of positions;
   wherein at least some of the plurality of positions of the sample are arranged at different points in the direction of propagation of the beam by adjusting the position of the sample while keeping beam optics parameters constant.

37. The method of claim 36 wherein the beam-induced deposition of material uses at least one precursor material, the beam-induced etching uses at least one etching gas, and
   wherein varying one or more parameters of the beam-induced etching comprises at least one of:
     (i) increasing the intensity of the beam of charged particles;
     (ii) changing an interaction duration of the beam of charged particles with the sample;
     (iii) reducing an amount of the at least one precursor material provided to the part of the surface of the sample to reduce the concentration of the at least one precursor material at the part of the surface of the sample;
     (iv) depleting the precursor material in the core region of the beam of charged particles;

(v) reducing an amount of the at least one etching gas provided to the part of the surface of the sample to reduce the concentration of the at least one etching gas at the part of the surface of the sample; or (vi) depleting the etching gas in the core region of the beam of charged particles.

38. The method of claim 36 wherein when the persistent interactions become saturated with respect to the beam intensity, increasing the beam intensity by a factor of two causes a production rate of the persistent interactions to increase by at most 10%.

39. The method of claim 36 wherein in a lower intensity background region outside of the core region of the beam of charged particles, the persistent interactions are not saturated with respect to the beam intensity.

* * * * *